(12) United States Patent
Cheskis et al.

(10) Patent No.: US 9,664,033 B2
(45) Date of Patent: May 30, 2017

(54) SYSTEM FOR DETERMINING POSITION OF MARKER DEPTH COORDINATES FOR CONSTRUCTION OF GEOLOGICAL MODEL OF DEPOSIT

(71) Applicant: OOO Rock Flow Dynamics, Moscow (RU)

(72) Inventors: Olga Andreevna Cheskis, Moscow (RU); Semen Leonidovich Tregub, Moscow (RU); Andrey Sergeevich Kazarov, Moscow (RU)

(73) Assignee: OOO Rock Flow Dynamics, Moscow (RU)

( * ) Notice: Subject to any disclaimer, the term of this patent is extended or adjusted under 35 U.S.C. 154(b) by 777 days.

(21) Appl. No.: 14/094,783

(22) Filed: Dec. 2, 2013

(65) Prior Publication Data

US 2014/0156244 A1 Jun. 5, 2014

(51) Int. Cl.
*G06F 17/50* (2006.01)
*E21B 47/04* (2012.01)
*G01V 99/00* (2009.01)
*G01V 1/40* (2006.01)
*G01V 11/00* (2006.01)
*G01V 1/50* (2006.01)

(52) U.S. Cl.
CPC ........... *E21B 47/04* (2013.01); *G01V 1/40* (2013.01); *G01V 1/50* (2013.01); *G01V 11/00* (2013.01); *G01V 99/005* (2013.01); *G01V 2210/60* (2013.01); *G06F 17/5009* (2013.01)

(58) Field of Classification Search
USPC ................................................. 703/2, 5, 6
See application file for complete search history.

(56) References Cited

U.S. PATENT DOCUMENTS

| 6,668,083 B1 * | 12/2003 | Verdonck | G06T 7/60 382/128 |
| 2007/0276604 A1 | 11/2007 | Williams | |
| 2010/0004864 A1 | 1/2010 | Thorne | |
| 2014/0156192 A1 * | 6/2014 | Cheskis | G01V 1/50 702/6 |

FOREIGN PATENT DOCUMENTS

EA 200600036 A1 12/2008

\* cited by examiner

*Primary Examiner* — Thai Phan
(74) *Attorney, Agent, or Firm* — TransPacific Law Group; Pavel I. Pogodin, Esq.

(57) ABSTRACT

System for building a geological model of oil or other mineral deposit. The system determines functionals represented by the sum of coefficients of correlation for a set of well log curves. A technical result is the improvement of the accuracy of evaluating parameters that are used to build geological model of the location of oil or other deposits. The system makes it possible, given set of markers, chosen as initial solution and to calculate their depths at each well to ensure the best total correlation. For any marker in the set, functional is determined, represented by the sum of correlation coefficients for the set of well log methods for pairs of wells located within specified distance from one another. Partial derivatives are evaluated for this functional, and the vector thus obtained is smoothed and used to search for a larger value of the functional within certain segment along this vector.

1 Claim, 2 Drawing Sheets

SYSTEM FOR DETERMINING POSITION OF MARKER DEPTH COORDINATES FOR CONSTRUCTION OF GEOLOGICAL MODEL OF DEPOSIT

CROSS-REFERENCE TO RELATED PATENT APPLICATIONS

This U.S. patent application is related to the following U.S. patent applications filed on the same day: U.S. patent application Ser. No. 14/094,773 entitled "SYSTEMS AND METHODS FOR DETERMINING POSITION OF MARKER DEPTH COORDINATES FOR CONSTRUCTION OF GEOLOGICAL MODEL OF DEPOSIT," U.S. patent application Ser. No. 14/094,776 entitled "SYSTEMS AND METHODS FOR DETERMINING POSITION OF MARKER DEPTH COORDINATES FOR CONSTRUCTION OF GEOLOGICAL MODEL OF DEPOSIT," and U.S. patent application Ser. No. 14/094,779 entitled "SYSTEM FOR DETERMINING POSITION OF MARKER DEPTH COORDINATES FOR CONSTRUCTION OF GEOLOGICAL MODEL OF DEPOSIT," all of which are incorporated by reference herein in their entirety.

BACKGROUND OF THE INVENTION

Technical Field

The invention relates to a system for building a geological model of oil or other mineral deposit. In particular, the system relates to a system for determining functionals representing the sum of correlation coefficients for a set of well log curves.

Description of the Related Art

Patent Publication No. EA 200600036 A1, E21B 7/04, 30 Dec. 2008 describes a program package to be stored in computer memory in a workstation or other computer system, designed for constructing a single-well model of a mineral deposit.

U.S. Patent Application Publication US 2007/0276604 A1, G01V 1/00, 29 Nov. 2007 presents a method for visualization and organization of data on oil and gas deposits. The method enables the processing of well log data with the use of raster images of well log records, which are digitized for the further placement of a marker on them.

U.S. Patent Application Publication No. US 2010/0004864 A1, G01V 9/00, 7 Jan. 2010 presents a method of correlation of well logs, involving automatically correlating data from a set of well log records, describing information in different land areas.

The aforesaid U.S. Patent Application Publication No. US 2010/0004864 describes the processing of data on wells that form a group and the implementing, with the use of special processing means, of correlation of data on the positions of those wells with the use of computation modules. However, the conventional systems fail to ensure highly accurate determinations of the location of mineral deposits, and in particular oil wells. In addition, the positions of marker depths cannot be calculated using the conventional systems.

Therefore, new and improved systems for generating high-accuracy geological models are needed.

SUMMARY OF THE INVENTION

The embodiments described herein are directed to methods and systems that substantially obviate one or more of the above and other problems associated with conventional systems for constructing of geological models.

In accordance with one aspect of the embodiments described herein, there is provided a computerized system for determining a position of marker depth coordinates at wells W from a reference group of wells in the building of a geological model of a deposit, the computerized system comprising a module for determining wells configured to determine a well W and a plurality of wells lying within a predetermined neighborhood of well W, wherein the predetermined neighborhood has a radius R, a module for determining a marker depth configured to determine the marker depth mark in each well W and in wells lying within the predetermined neighborhood of the well W, a module for determining a value of a functional configured to valuate the functional in points where marker depth marks $\{z_i\}$ are available, a module for composing a gradient vector configured to compose the gradient vector for points where the marker depth marks $\{z_i\}$ are available, a module for smoothing the gradient vector configured to smooth the gradient vector by replacing each component of the gradient vector at the well W by a mean value of the gradient vector components at wells lying within the predetermined neighborhood, a module for searching for a larger value of the functional configured to search for a value of the functional C, which is greater than the previous value found for the functional C, a module for improving the value of marker depth configured to improve the determined value of the marker depth mark $\{z_i\}$ by searching for a larger value of the marker depth mark $\{z_i\}$, a module for additionally smoothing the gradient vector configured to smooth the gradient vector by replacing each component of the vector at the well W by the mean value of the components in the predetermined neighborhood, a module for sorting the marker depth configured to sort the values of marker depth marks $\{z_i\}$ by the depth, and an iteration module, the iteration module being related to the module for composing the gradient vector, the module for smoothing the gradient vector, the module for searching for the larger value of the functional, the module for improving the value of marker depth, the module for additional smoothing of the gradient vector, and the module for sorting the marker depth; the iteration module cyclically repeating the procedures of the module for composing the gradient vector, the module for smoothing the gradient vector, the module for searching for the larger value of the functional, the module for improving the value of marker depth, the module for additional smoothing of the gradient vector, and the module for sorting the marker depth until information is obtained that no larger value of the functional is found.

Additional aspects related to the invention will be set forth in part in the description which follows, and in part will be obvious from the description, or may be learned by practice of the invention. Aspects of the invention may be realized and attained by means of the elements and combinations of various elements and aspects particularly pointed out in the following detailed description and the appended claims.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically.

DETAILED DESCRIPTION

In the following detailed description, reference will be made to the accompanying drawing(s), in which identical functional elements are designated with like numerals. The aforementioned accompanying drawings show by way of illustration, and not by way of limitation, specific embodiments and implementations consistent with principles of the present invention. These implementations are described in sufficient detail to enable those skilled in the art to practice the invention and it is to be understood that other implementations may be utilized and that structural changes and/or substitutions of various elements may be made without departing from the scope and spirit of present invention. The following detailed description is, therefore, not to be construed in a limited sense. Additionally, the various embodiments of the invention as described may be implemented in the form of a software running on a general purpose computer, in the form of a specialized hardware, or combination of software and hardware.

The problem addressed by one or more of the described embodiments of the invention is the building of a geological model with precisely determining the position of oil or other deposits. Specifically, a technical result achieved by one or more embodiments described herein is the improvement of the accuracy of evaluation of the parameters that are used to create a geological model of location of oil or other mineral deposits.

The problem of correlating sets of well log curves implies the presence of a group of wells surveyed by logging methods at a level sufficient for stratigraphic and lithological analysis. Without loss of generality, it is assumed that such surveys result in a set of well log curves, containing a curve for each well in the group and for each method. An important step in the building of a geological model of a deposit is the tracing of boundaries of stratigraphic complexes or lithological features. Such boundaries can be identified along wells and extended to the area under study by interpolation. The boundaries, referred to as markers, have depth marks in wells at sites where well log curves show joint singularities.

The described exemplary embodiments of the system for determining functionals are designed for evaluating the depths of markers by calculating maximums of functionals, which characterize the similarity of sets of well log curves in marker points in wells. The depths of markers are sought for wells that are not in the reference group for which such depths have been specified in advance.

Figure 1:
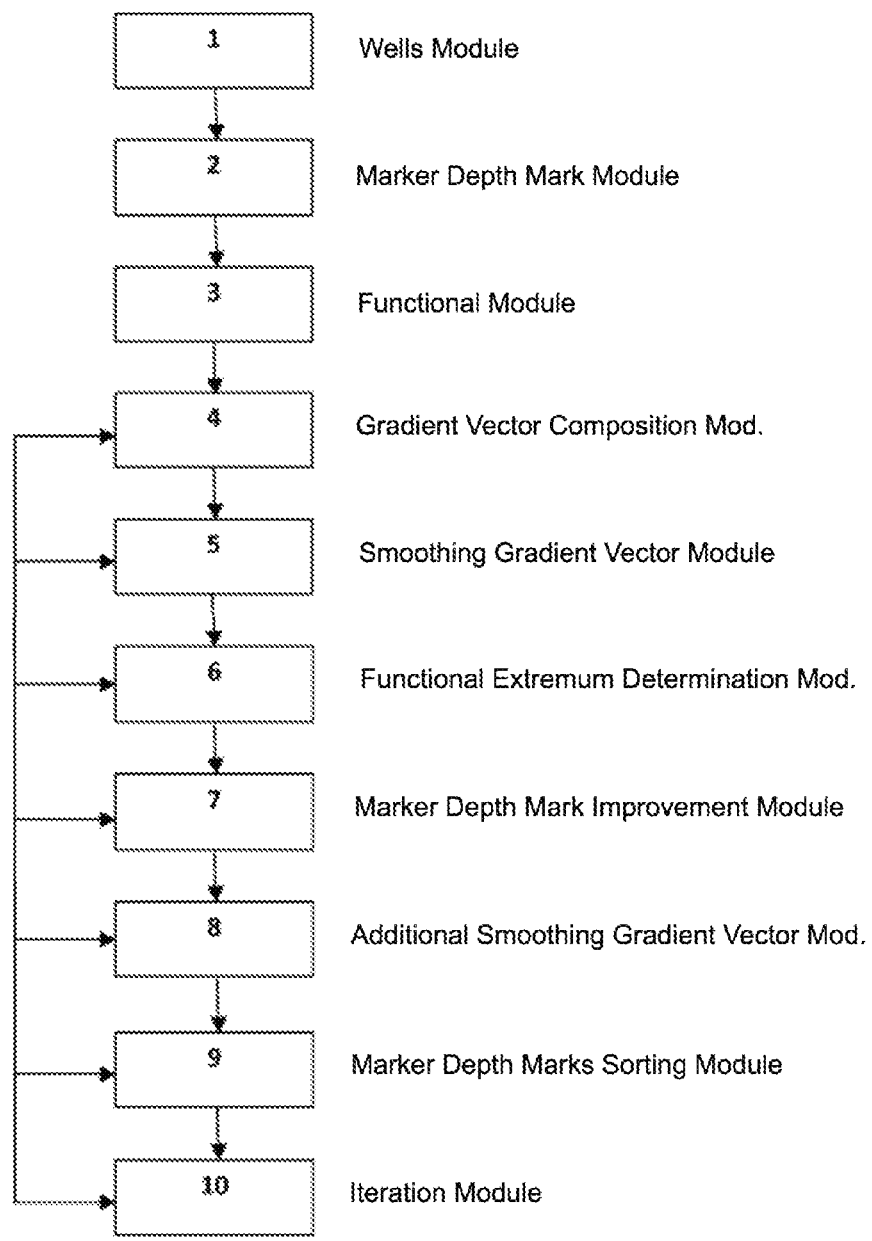
FIG. 1 an exemplary computerized system for determining a position of marker depth coordinates at wells W from a reference group of wells for building of a geological model of a deposit.

FIG. 1 an exemplary computerized system for determining a position of marker depth coordinates at wells W from a reference group of wells for building of a geological model of a deposit. The aforesaid problem is solved by the incorporation into the system designed for determining functionals for a set of well log curves and the positions of marker depths of the following modules: module 1 for determining wells, which determines a well W and the wells lying within a specified neighborhood of well W, where the neighborhood has a radius R; module 2 for determining the marker depth mark, which determines the marker depth mark $\{z_i\}$, i=0, . . . , n in each well W and in wells lying within a specified neighborhood of the well W; module 3 for determining the values of the functional, which evaluates the functional in points where marker depth marks $\{z_i\}$ are available; module 4 for composing the gradient vector, which composes gradient vector for points where marker depth marks $\{z_i\}$ are available; module 5 for smoothing gradient vector, which smoothes the gradient vector by replacing each component of the gradient vector at the well W by the mean (averaged) value of corresponding gradient vector components of all gradient vectors at wells lying within a neighborhood with radius R; module 6 for the search of a larger value of the functional, which searches for a value of the functional C, which is greater than the previous value found for the functional C, by calculating the aforesaid value of the functional C at a location, which is offset from the previous location by a predetermined offset distance (called step) in the direction of the previously calculated and smoothed gradient vector; and, if such value is not found, the current value of the marker depth mark is assumed determined; module 7 for the improvement of the marker depth mark, which improves the above determined value of marker depth mark $\{z_i\}$ by searching for a larger value of the marker depth mark $\{z_i\}$ within the specified step; module 8 of additional smoothing of the gradient vector, which, for the marker depth mark $\{z_i\}$ at which the value of the functional C is maximal, smoothes the gradient vector by replacing each component of the vector at the well W by the mean value of the components in the neighborhood with a radius R, reduced by a specified value; module 9 for sorting the determined marker depth marks, which sorts the values of marker depth marks $\{z_i\}$ by the depth value of the marker depth marks, such that the resulting marker depth marks are ordered by the corresponding depth value; and module 10 of iteration, which is related with the module 4 for composing gradient vector, module 5 for smoothing gradient vector, module 6 for the search for a larger value of the functional, module 7 for improving the values of marker depth mark, module 8 for additional smoothing of the gradient vector, and module 9 for sorting marker depth marks by the depth; the iteration module reiterates the procedures of the modules related with it until information is obtained showing that no larger value of functional C was found.

The described embodiments of the inventive system make it possible, for a set of markers chosen as initial solutions, to evaluate their depths at each well to ensure best total correlation. For each marker in the set, a functional is defined as the sum of correlation coefficients for the set of well log methods for pairs of wells located within the specified distance from one another. Partial derivatives are calculated for this functional, and the vector thus obtained is smoothed and used to search for a larger value of the functional within a segment along this vector. If no greater value is found, the last position of marker mark is taken as the solution of the problem, while if such value is found, the solution point is smoothed and the process is reiterated. At each iteration, the marker depths are sorted.

The embodiments of the inventive system described here allow the marker depths to be calculated by evaluating maximums of functionals characterizing the similarity of sets of well log curves in marker points at wells.

Namely, suppose that $\{z_i\}=0, \ldots, n$ are depth marks at wells $W_i$. We define a functional in n-dimensional space as follows $$C(z_0, \ldots, z_n) = \sum_{i=0}^{n} \sum_{j=i+1}^{n} B(i, j) \cdot C(z_i, z_j),$$

where $B(i,j)$ is a function, which is equal to 1, when the distance between wells i and j is less than or equal to the given value R, and 0, when this distance is greater than R, $C(z_i, z_j)$ are coefficients of correlation for a set of well log methods $\{F_k\}$, k=0, ..., m, calculated as:

$$C(z_i, z_j) = \frac{\sum_{k=0}^{m} w_k \cdot C_k(z_i, z_j)}{\sum_{k=0}^{m} w_k}.$$

Here $C_k(z_i, z_j)$ denotes the coefficient of correlation for the kth well logging method in points $z_i$ and $z_j$ at wells i and j, respectively. This coefficient varies from −1 to 1, it is calculated as:

$$C_k(z_i, z_j) = \frac{\int F_{k,i}(z_i + x) F_{k,j}(z_j + x) dx}{\sqrt{\int F_{k,i}^2(z_i + x) dx} \sqrt{\int F_{k,j}^2(z_j + x) dx}},$$

where $F_{k,i}$ is the curve of the kth method at the ith well.

Maximums of those functionals are sought for with the use of gradient descent method (in this case, this is ascent), including the calculation of the gradient vector, whose coordinates are partial derivatives of the functional, and the search for maximal values along the direction of this vector. To neutralize the typical problems in the application of gradient descent method, a "shaking" procedure is applied to intermediate solutions of the algorithm; this procedure consists in smoothing the current point of solution and the current gradient vector. Such smoothing is carried out with a specified coefficient, which decreases with the number of iterations and nearly disappears at the last iterations of the algorithm. The smoothing can be carried out, for example, by moving average, with the smoothing coefficient in this case being window size. Since changes in the current point of solution can be accompanied by a considerable deviation of its depth at some wells from depths at other wells, resulting in that they can become closer to other markers of the set in terms of depth, markers of the set were sorted at each well. The result of this sorting is that the depths corresponding to one marker in the set can be assigned to another one. This simple procedure reduces the scatter of marker depths in different wells.

Figure 2:
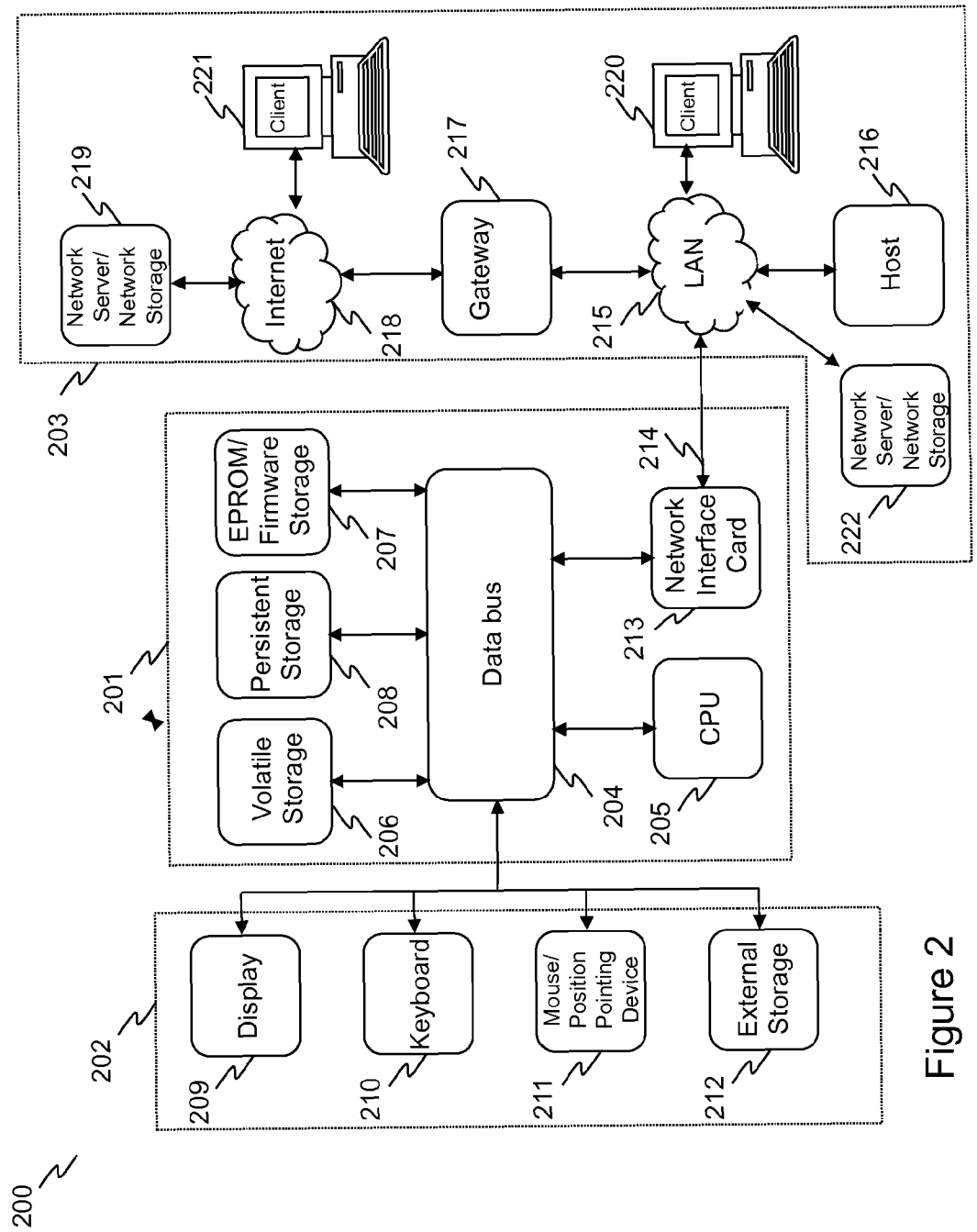
FIG. 2 is a block diagram that illustrates an exemplary embodiment of a computerized system upon which the described embodiments of the invention may be deployed.

FIG. 2 is a block diagram that illustrates an exemplary embodiment of a computer system 200 upon which the described invention may be deployed. The system 200 includes a computer platform 201, peripheral devices 202 and network resources 203.

The computer platform 201 may include a data bus 204 or other communication mechanism for communicating information across and among various parts of the computer platform 201, and a processor 205 coupled with bus 204 for processing information and performing other computational and control tasks. Computer platform 201 also includes a volatile storage 206, such as a random access memory (RAM) or other dynamic storage device, coupled to bus 204 for storing various information as well as instructions to be executed by processor 205, including the software application for proxy detection described above. The volatile storage 206 also may be used for storing temporary variables or other intermediate information during execution of instructions by processor 205. Computer platform 201 may further include a read only memory (ROM or EPROM) 207 or other static storage device coupled to bus 204 for storing static information and instructions for processor 205, such as basic input-output system (BIOS), as well as various system configuration parameters. A persistent storage device 208, such as a magnetic disk, optical disk, or solid-state flash memory device is provided and coupled to bus 204 for storing information and instructions.

Computer platform 201 may be coupled via bus 204 to a touch-sensitive display 109, such as a cathode ray tube (CRT), plasma display, or a liquid crystal display (LCD), for displaying information to a system administrator or user of the computer platform 201. An input device 210, including alphanumeric and other keys, is coupled to bus 204 for communicating information and command selections to processor 205. Another type of user input device is cursor control device 211, such as a mouse, a trackball, or cursor direction keys for communicating direction information and command selections to processor 205 and for controlling cursor movement on touch-sensitive display 209. This input device typically has two degrees of freedom in two axes, a first axis (e.g., x) and a second axis (e.g., y), that allows the device to specify positions in a plane. To detect user's gestures, the display 209 may incorporate a touchscreen interface configured to detect user's tactile events and send information on the detected events to the processor 205 via the bus 204.

An external storage device 212 may be coupled to the computer platform 201 via bus 204 to provide an extra or removable storage capacity for the computer platform 201. In an embodiment of the computer system 200, the external removable storage device 212 may be used to facilitate exchange of data with other computer systems.

The invention is related to the use of computer system 200 for implementing the techniques described herein. In an embodiment, the inventive system may reside on a machine such as computer platform 201. According to one embodiment of the invention, the techniques described herein are performed by computer platform 201 in response to processor 205 executing one or more sequences of one or more instructions contained in the volatile memory 206. Such instructions may be read into volatile memory 206 from another computer-readable medium, such as persistent storage device 208. Execution of the sequences of instructions contained in the volatile memory 206 causes processor 205 to perform the process steps described herein. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 205 for execution. The computer-readable medium is just one example of a machine-readable medium, which may carry instructions for implementing any of the methods and/or techniques described herein. Such a medium may take many forms, including but not limited to, non-volatile media and volatile media. Non-volatile media includes, for example, optical or magnetic disks, such as the persistent storage device 208. Volatile media includes dynamic memory, such as volatile storage 206.

Common forms of computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, an EPROM, a FLASH-EPROM, a flash drive, a memory card, any other memory chip or cartridge, or any other medium from which a computer can read.

Various forms of computer readable media may be involved in carrying one or more sequences of one or more instructions to processor 205 for execution. For example, the instructions may initially be carried on a magnetic disk from a remote computer. Alternatively, a remote computer can load the instructions into its dynamic memory and send the instructions over a telephone line using a modem. A modem local to computer system can receive the data on the telephone line and use an infra-red transmitter to convert the data to an infra-red signal. An infra-red detector can receive the data carried in the infra-red signal and appropriate circuitry can place the data on the data bus 204. The bus 204 carries the data to the volatile storage 206, from which processor 205 retrieves and executes the instructions. The instructions received by the volatile memory 206 may optionally be stored on persistent storage device 208 either before or after execution by processor 205. The instructions may also be downloaded into the computer platform 201 via Internet using a variety of network data communication protocols well known in the art.

The computer platform 201 also includes a communication interface, such as network interface card 213 coupled to the data bus 204. Communication interface 213 provides a two-way data communication coupling to a network link 214 that is coupled to a local network 215. For example, communication interface 213 may be an integrated services digital network (ISDN) card or a modem to provide a data communication connection to a corresponding type of telephone line. As another example, communication interface 213 may be a local area network interface card (LAN NIC) to provide a data communication connection to a compatible LAN. Wireless links, such as well-known 802.11a, 802.11b, 802.11g and Bluetooth may also used for network implementation. In any such implementation, communication interface 213 sends and receives electrical, electromagnetic or optical signals that carry digital data streams representing various types of information.

Network link 214 typically provides data communication through one or more networks to other network resources. For example, network link 214 may provide a connection through local network 215 to a host computer 216, or a network storage/server 222. Additionally or alternatively, the network link 214 may connect through gateway/firewall 217 to the wide-area or global network 218, such as an Internet. Thus, the computer platform 201 can access network resources located anywhere on the Internet 218, such as a remote network storage/server 219. On the other hand, the computer platform 201 may also be accessed by clients located anywhere on the local area network 215 and/or the Internet 218. The network clients 220 and 221 may themselves be implemented based on the computer platform similar to the platform 201.

Local network 215 and the Internet 218 both use electrical, electromagnetic or optical signals that carry digital data streams. The signals through the various networks and the signals on network link 214 and through communication interface 213, which carry the digital data to and from computer platform 201, are exemplary forms of carrier waves transporting the information.

Computer platform 201 can send messages and receive data, including program code, through the variety of network(s) including Internet 218 and LAN 215, network link 215 and communication interface 213. In the Internet example, when the system 201 acts as a network server, it might transmit a requested code or data for an application program running on client(s) 220 and/or 221 through the Internet 218, gateway/firewall 217, local area network 215 and communication interface 213. Similarly, it may receive code from other network resources.

The received code may be executed by processor 205 as it is received, and/or stored in persistent or volatile storage devices 208 and 206, respectively, or other non-volatile storage for later execution.

Finally, it should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein. The present invention has been described in relation to particular examples, which are intended in all respects to be illustrative rather than restrictive. Those skilled in the art will appreciate that many different combinations of hardware, software, and firmware will be suitable for practicing the present invention. For example, the described software may be implemented in a wide variety of programming or scripting languages, such as Assembler, C/C++, Objective-C, perl, shell, PHP, Java, as well as any now known or later developed programming or scripting language.

Moreover, other implementations of the invention will be apparent to those skilled in the art from consideration of the specification and practice of the invention disclosed herein. Various aspects and/or components of the described embodiments may be used singly or in any combination in the systems for constructing of geological models. It is intended that the specification and examples be considered as exemplary only, with a true scope and spirit of the invention being indicated by the following claims.

What is claimed is:

1. A computerized system for determining a position of marker depth coordinates at wells W from a reference group of wells in the building of a geological model of a deposit, the computerized system comprising a module for determining wells configured to determine a well W and a plurality of wells lying within a predetermined neighborhood of well W, wherein the predetermined neighborhood has a radius R, a module for determining a marker depth configured to determine the marker depth mark in each well W and in wells lying within the predetermined neighborhood of the well W, a module for determining a value of a functional configured to valuate the functional in points where marker depth marks $\{z_i\}$ are available, a module for composing a gradient vector configured to compose the gradient vector for points where the marker depth marks $\{z_i\}$ are available, a module for smoothing the gradient vector configured to smooth the gradient vector by replacing each component of the gradient vector at the well W by a mean value of the gradient vector components at wells lying within the predetermined neighborhood, a module for searching for a larger value of the functional configured to search for a value of the functional C, which is greater than the previous value found for the functional C, a module for improving the value of marker depth configured to improve the determined value of the marker depth mark $\{z_i\}$ by searching for a larger value of the marker depth mark $\{z_i\}$, a module for additionally smoothing the gradient vector configured to smooth the gradient vector by replacing each component of the vector at the well W by the mean value of the components in the predetermined neighborhood, a module for sorting the marker depth configured to sort the values of marker depth marks $\{z_i\}$ by the depth, and an iteration module, the iteration module being related to the module for composing the gradient vector, the module for smoothing the gradient vector, the module for searching for the larger value of the functional, the module for improving the value of marker depth, the module for additional smoothing of the gradient vector, and the module for sorting the marker depth; the iteration module cyclically repeating the procedures of the module for composing the gradient vector, the module for smoothing the gradient vector, the module for searching for the larger value of the functional, the module for improving the value of marker depth, the module for additional smoothing of the gradient vector, and the module for sorting the marker depth until information is obtained that no larger value of the functional is found.

\* \* \* \* \*